Figure 1:
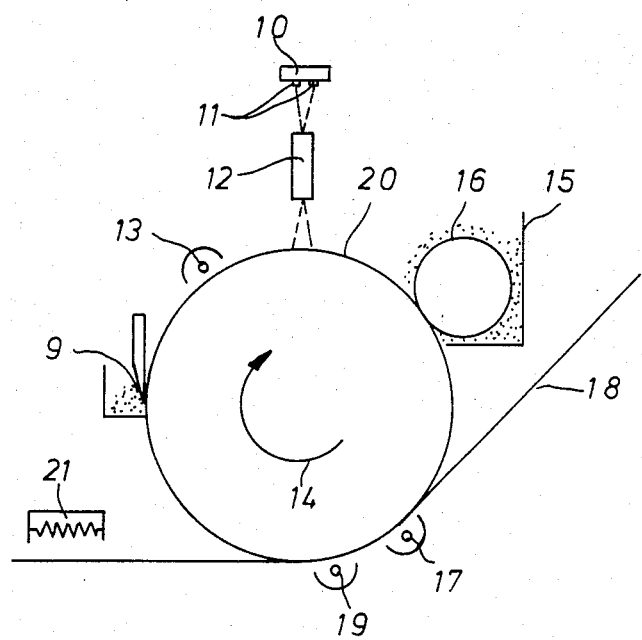

United States Patent [19]

De Schamphelaere et al.

[11] Patent Number: 4,536,778
[45] Date of Patent: Aug. 20, 1985

[54] RECORDING APPARATUS WITH MODULAR LED ARRAY OF HIGHER PRODUCTION YIELD

[75] Inventors: Lucien A. De Schamphelaere; Etienne M. De Cock, both of Edegem; Werner E. De Bondt, Temse; Freddy M. Librecht, Boechout; Gerard J. Boeve, Edegem; Willy F. Van Peteghem, Berchem, all of Belgium

[73] Assignee: AGFA-Gevaert N.V., Mortsel, Belgium

[21] Appl. No.: 436,671

[22] Filed: Oct. 26, 1982

[30] Foreign Application Priority Data

Feb. 19, 1982 [GB] United Kingdom ............... 8205024

[51] Int. Cl.³ ........................................... G01D 15/14
[52] U.S. Cl. ............................... 346/160; 346/107 R; 340/753
[58] Field of Search ................ 346/160, 153.1, 155, 346/107 R; 355/1, 3 R; 354/3, 4, 5; 358/300, 302; 340/753, 754, 762, 782

[56] References Cited

U.S. PATENT DOCUMENTS

| 3,952,311 | 4/1976 | Lapeyre ..................... 346/107 R X |
| 4,318,597 | 3/1982 | Kotani et al. ............................ 354/5 |
| 4,413,269 | 11/1983 | Pawletko ............................ 346/154 |
| 4,427,275 | 1/1984 | Stalzer ..................................... 354/4 |
| 4,455,562 | 6/1984 | Dolan et al. ..................... 346/160 X |
| 4,455,578 | 6/1984 | Fearnside ............................ 358/302 |

Primary Examiner—E. A. Goldberg
Assistant Examiner—Fred L. Kampe
Attorney, Agent, or Firm—William J. Daniel

[57] ABSTRACT

A recording device for linearly recording information upon a moving photoreceptor using a recording head that can be manufactured more readily. The recording head is made with a plurality of modules, each module comprising LED chip means having an aggregate length (n) greater than the length (o) of the base plate of the module and projecting exteriorly of the module side edges, and a common integrated control circuit for all the LED's mounted on the base plate of a given module, the outputs of such circuit being connected by wire bonding to the respective LED's on the module.

8 Claims, 10 Drawing Figures

RECORDING APPARATUS WITH MODULAR LED ARRAY OF HIGHER PRODUCTION YIELD

The present invention relates to a recording apparatus for linewise recording information upon a moving photoreceptor.

Apparatus for recording information upon a moving photoreceptor are known comprising a plurality of stationary pointlike light sources that are arranged in a row that extends transversely of the direction of displacement of a photoreceptor, and that are individually energizable thereby information-wise to expose the photoreceptor in response to delivered information signals as the photoreceptor moves past the row of light sources. The movement of the photoreceptor may occur either continuously or stepwise.

The transfer of the images of the light sources on the photoreceptor may occur by means of lens arrangements, fiber optics or fiber pipes, self focussing fibers, or the like.

In the foregoing kind of recording apparatus the light sources must be sufficiently small in order to achieve an acceptable image resolution and the spacing between the images of the light sources transferred to the photoreceptor must be small in order that the visual impression of an uninterrupted transverse line on the photoreceptor can be obtained.

It is considered in the art that at least 10 light points per mm are required on the photoreceptor, so that the width of a standard DIN A4 photoreceptor size, namely 216 mm, requires a number of at least about 2200 discrete light sources.

A plurality of closely spaced small light sources may be formed by LED's (light-emitting diodes) if they are formed as an array of LED's produced on a monolithic chip. Unfortunately, arrays of LED's measuring up to 216 mm cannot be obtained at present, since the manufacturing of the LED's is based on a series of operations carried out on mono-crystalline substrates with a length limited to approximately 50 mm.

Although it is possible to obtain a defect-free array of LED's on a 50 mm substrate, the continuous production of such arrays under industrial conditions is not economically feasible. Arrays on a 50 mm substrate normally have to be cut into shorter lengths in order to obtain defect free arrays and experience shows that the average length of defect-free arrays is between about 1 and 10 mm.

In order to form arrays up to 216 mm a multiplicity of small component arrays have to be assembled in alignment.

This assembling can occur by mounting small chip sub-units by means of screws to a common bar. This technique is disclosed in U.S. Pat. No. 4,318,597 to OKI Electric Industry Co, Ltd., relating to an optical printing head for optical printing devices. The disclosed technique has the disadvantage that relatively large supports are required for the chips in order to provide space for the screws, so that considerable spacing distances result between the distinct rows of radiation emitters, whereby large capacity memories are required in order to temporarily accumulate information during a delay that depends on the speed of the receptor and the spacing between the rows of radiation emitters.

A by far preferred method is the mounting of the chips by means of adhesive directly on a common printing head support. This technique has the disadvantage that replacement of a defective chip, that is a chip with one or more defective radiation sources, is not possible. The problem is aggravated by the fact that final testing of the radiation sources can only be performed if the radiation source chips are connected to their related driving circuits, but once the bondings to the chips have been made these bondings cannot be broken anymore without destroying the components.

As a matter of fact, it has even been shown that previous testing of the chips with the radiation sources, and of the driving circuits, does not always guarantee that the combination of the radiation sources with the driving circuits operates satisfactorily for every radiation source channel, so that final testing only of the complete assembly permits a judgement of the quality of the unit. In consequence, the rate of production loss in the fabrication of the printing heads is high.

Another example of the assembly of a printing head by means of multichip technology is disclosed in the "Conference Publication No. 80, 1971", of the I.E.E. conference on displays, London 7-10 September, 1971.

A further difficulty is formed by the connection of the different driving circuits to the respective radiation sources. Referring again to the printing device disclosed in the above-mentioned U.S. patent, it will be recognized that electrical circuit structures with thousands of current paths are required in order to establish the connection between the radiation sources on the recording head, and the driving circuitry comprising the drivers, the shift registers, the memories, the gates, etc. Considering the required packaging density of the structure, so-called thin film structures are required the manufacture of which is expensive, and the manipulation of which is delicate.

It is known in the electrical switching art that the number of electric connections may be reduced by the application of multiplexing techniques. An example of multiplexing in an optical printing head is disclosed in GB Pat. No. 2,042,746 A to Savin Corp., relating to a multiple variable light source photographic printer. Disadvantages of multiplexing are that still a separate connection structure, although with reduced number of connection paths, is required, and that the driving currents for the radiation sources must be increased in proportion to the reduction in the number of basic connections. For instance, the driving of a LED that occurs without multiplexing at 2 mA during 600 usec recording time for one recording line, would have to occur at 100 mA if as a consequence of multiplexing by a factor 50, only 12 usec would be available per LED. Currents of this order of magnitude put high demands on the connection techniques of thin film circuits.

It is the object of the present invention to provide a recording apparatus of the described kind, wherein the construction of the printing head is performed on a modular basis, i.e., from a plurality of separate modules, wherein direct chip to chip bonding is applied, wherein driving circuits and radiation sources form integrated modular units, so that an economic and a reliable construction of the recording head becomes possible, whereby a high fabrication yield may be obtained.

According to the present invention, a recording apparatus for linewise recording information on a moving photoreceptor, said apparatus comprising a recording head with a multiplicity of addressable and energisable pointlike radiation sources or emitters in at least one row extending transversely of the direction in which the photoreceptor moves when the system is in use, said row being composed by the assembly in alignment of a plurality of chips on each of which at least one row of uniformly spaced radiation sources is formed, and said apparatus comprising also electrical control means for said radiation sources, is characterized in that said recording head comprises an elongated bar onto which a plurality of modules are fitted in good heat-conductive relationship, each module comprises an electrically conductive metal base plate onto which radiation source chip means is mounted in good electrical and heat-conductive relationship, the length of each base plate being smaller than the aggregate length of the chip means thereon so that on at least one end and preferably both ends of the base plate a chip end extends beyond the end edge of the base plate, the chip ends are cut so close to the outermost radiation source on the chip means, and the modules with the chip means are mounted so closely ranged next to each other, that at least one uninterrupted row of equally spaced radiation sources is formed along the length of the recording head, and that the electrical control means is in the form of at least one control chip mounted on each module for a row of radiation sources, the control chip running parallel with the row of radiation sources and being provided with a plurality of output terminals that are each connected by wire bonding to a corresponding radiation source.

The construction of the recording head in the form of an assembly of integrated modules offers the possibility to completely test each module before it is mounted in the head.

The feature that the length (i.e. the dimension measured parallel to the axis of the recording head) of the base plate of each module is smaller than the collective length of the radiation source chip means thereon whereby the chip ends extend beyond the base plate end edges, means an important economization in the manufacturing of the head. As a matter of fact, the tolerances that are imposed upon the accuracy of machining of the sides of the base plates are now much broader, i.e., in the order of magnitude of some tenths of a millimeter only, since upon assembling the modules the end edges of the emitter chips abut, or nearly abut each other whereas the clearance spacing between opposed side edges of the base plates themselves is considerably larger. If the chip ends were to lie flush with the end edges of the base plates, a much greater precision would be required for the base plates in order to fit together in such a way that an uninterrupted row or rows of radiation sources would be formed by the assembled modules. Also, a high precision would be required in the mounting of the radiation source chips on the base plates in order to make sure that chip and plate edges would precisely coincide.

The integrated mounting of the radiation source chip means and the related control chips on one base plate makes it possible to use chip to chip bonding. Thus there are no additional thin film connection structures required, and the recording head has a limited number only of input terminals.

The disadvantage that is inherent to chip to chip bonding, namely the practical impossibility to recover a chip if after testing of the combined chips it appears that there yet are one or more defective channels, i.e., emitters, is now less important, since final testing now occurs on the modules before their assembling in the head so that an occasional defect leads to the loss of a module but not of the complete recording head.

The term "radiation source chip means" as used in the present specification denotes an assembly in line of two or more chips on one module that provide an uninterrupted row or rows of radiation sources, as well as one single chip that covers one module.

The term "electrically conductive" for the base plate denotes that the radiation source chip means mounted thereon are with their underside in galvanic contact with the upper surface of the base plates. Thus the base plates can be made from metal such as aluminium, copper, brass, etc., but the base plates may also be made from an insulator such as glass or ceramic, at least the upper surface of which has been provided wth an electrically conductive layer, e.g. by vacuum deposition of a metal or screening of conductive paste. Alternatively, the base plates may be made from an insulating material, e.g. polymer, that has been made electrically conductive up to a sufficient degree, by the incorporation of suitable electrically conductive materials.

The elongated bar onto which the modules are mounted may be electrically conductive or insulating. Conductive bars can be made from aluminium, brass, metalized ceramic, etc., as described already for the base plates of the modules. In the case of electrically insulating bars, the electric connection of the modules to a common lead may occur by individual connections by wire bonding or the like, as known in the art.

Various kinds of radiation sources can be used in carrying out the present invention. The sources can be any active chip areas that can be controlled either to directly produce radiation, or to intercept radiation that is produced by a source remote from the chips. The first of these categories comprises active radiators such as LED's, vacuum fluorescent based sources, plasma based sources, and the like. The second category comprises elements or light valves that are capable of modulating the light of a suitable radiation source. An example of such valves is a PLZT device. Examples of suitable radiation sources for such valves are incandescent bulbs, fluorescent tubes, etc.

Use can be made of a photoreceptor in the form of a sheet or web onto which the information is finally recorded such as a support provided with a silver halide or a photoconductive layer. The photoreceptor may alternatively be a transfer medium, onto which an information image is produced that is then transferred to a receptor that is not photo-sensitive, such as plain paper. Known photoreceptors include ZnO, CdS and other suitable photoconductors.

An optical transfer means may be used for converging the radiation from the radiation sources onto the receptor. It is possible to avoid in this way direct contact of the moving receptor with the radiation sources.

Advantageous optional features of the invention are as follows.

The ends of the radiation source chip means extend at both sides of the base plates of the modules beyond the corresponding edge of the base plate. In this way, the feature of the uncritical precision of a base plate edge, and of the uncritical mounting of a radiation source chip on a base plate, is extended to both lateral ends of a module.

A control chip comprises integrated shift register means, latch register means and drivers, and also an input terminal for the serial-in loading of the shift register and an output terminal for connection of the shift register means to the input of the control chip of the next module. This technique of using the serial-in loading of shift registers and the parallel-out transfer towards the radiation sources, drastically reduces the number of external connections to a module.

Each radiation source chip comprises two staggered parallel rows of radiation sources, and on both sides of said chip there is provided a control chip, each control chip being connected with the adjacent row of radiation sources. In this way, the resolution of the recording head is doubled since the number of radiation sources per unit of length of the head has been increased by a factor two. The recording of the sources of both rows onto one line on the photoreceptor may occur by means of appropriate optical means that converge the images of the two rows onto one line on the photoreceptor, or by means of memory circuits that keep the signals for one row of sources delayed during a period that corresponds with the quotient of the distance between the projected lines of the rows of sources the receptor, by the speed of advance of the photoreceptor.

The two edge portions of the ends of each chip which cross or intersect the rows of radiation sources, in the case of chips with staggered rows of sources, are generally inclined with respect to said rows, the sum of the distance ($a_1$, $a_2$) separating the centres of the end radiation sources of each sub-row on the chip from the adjacent said chip end portions, said distances being measured along lines passing through the centres of the radiation sources of the respective row, is not greater than the spacing (b) between the centres of neighbouring radiation sources in such sub-row, and the closeness of neighbouring chips to each other is such that the centres of neighbouring radiation sources in each row which belong to different chips are at the same spacing as the centres of neighbouring radiation sources belonging to a sub-row on a chip.

Preferably, the angle $\alpha$ between said general direction of said end portions and the direction of movement of said photoreceptor is such that $\tan \alpha = s/d$, wherein s is the staggering between two rows of sources, and d is the distance between said two rows. Even more preferably, the edge portion of the base plate of the module over which the chip end protrudes, is inclined in correspondance with the inclination of the side edge of the chip.

The apparatus is arranged in such a way that each module comprises radiation source chips means with one row of radiation sources and with one control chip that is connected by wire bonding with the respective radiation sources, that one module forms a module with a second, identical, module that is rotated over 180 degrees as compared with a first module, the relative positioning of both modules being such that the radiation sources of both parallel rows are staggered with respect to each other, and that a plurality of module pairs are lengthwise assembled to produce two uninterrupted rows of staggered radiation sources over the length of the recording head. This arrangement permits to further increase the yield as will later be disclosed in the description, since, as compared with the previous option of the recording head, each module now comprises only half the number of radiation sources per unit of length.

Figure 2:
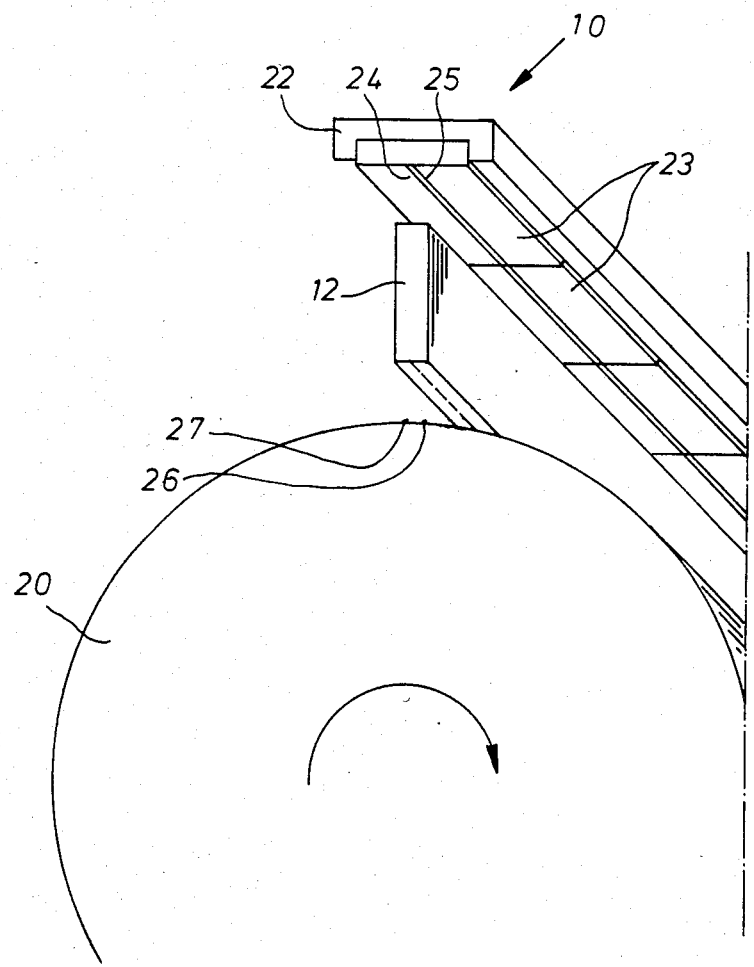
Figure 3:
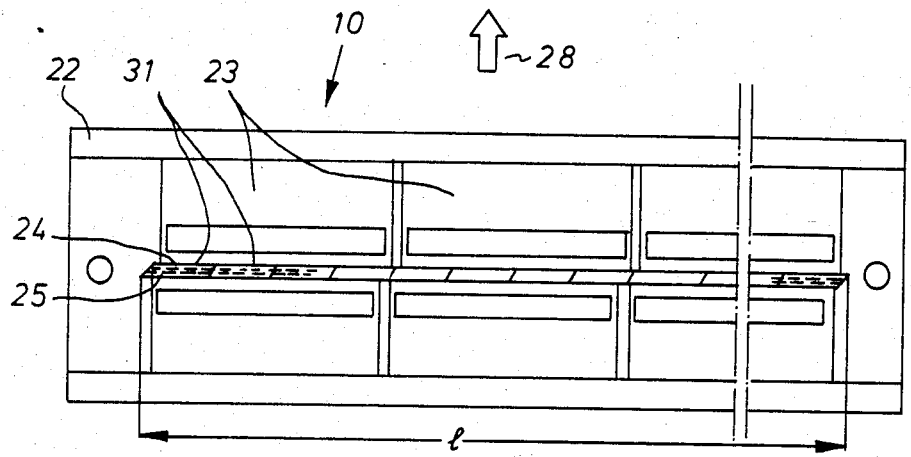
Figure 4:
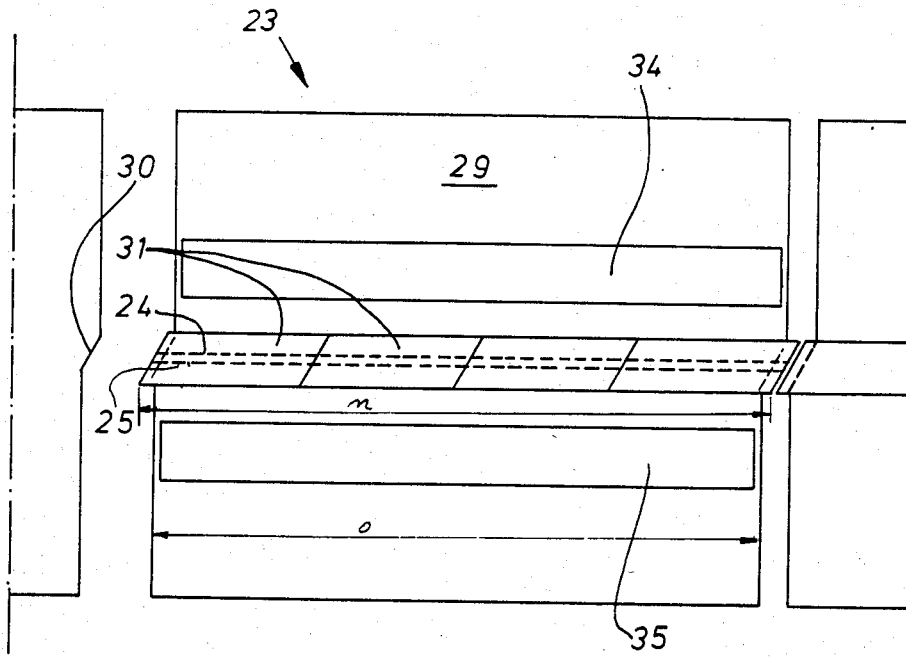
Figure 5:
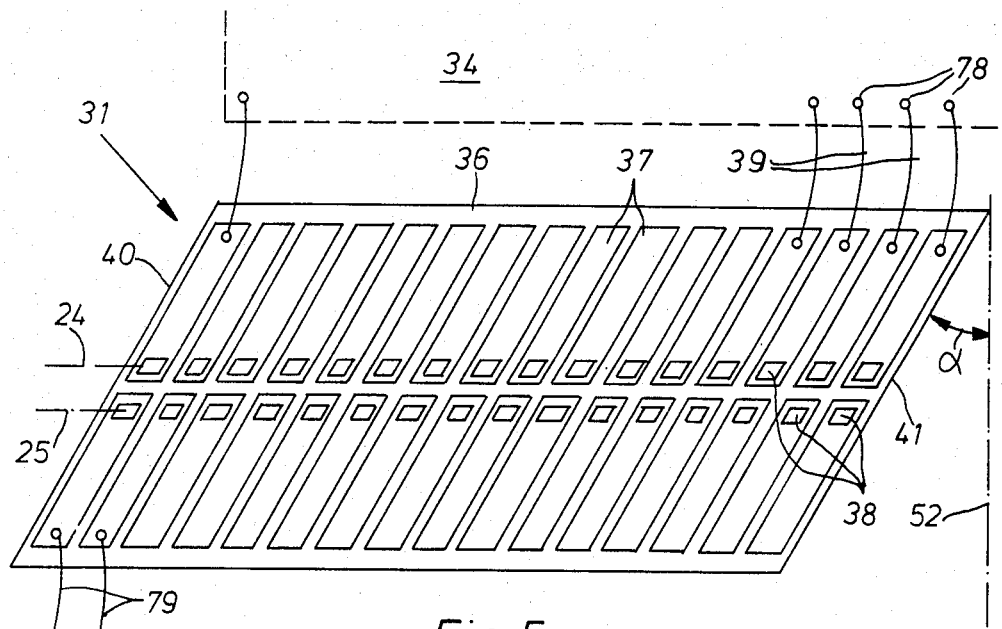
Figure 6:
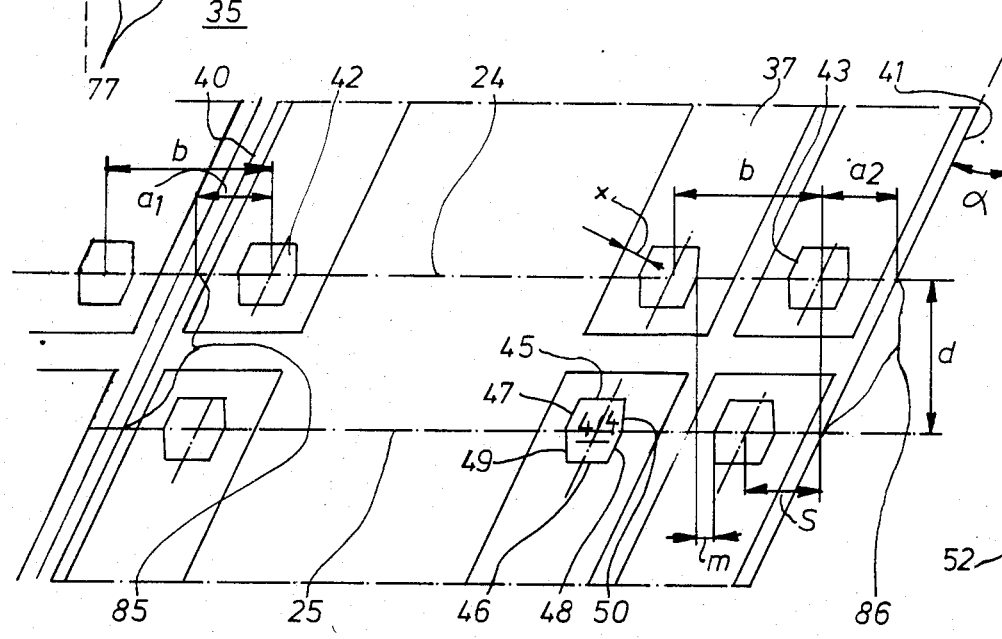
Figure 7:
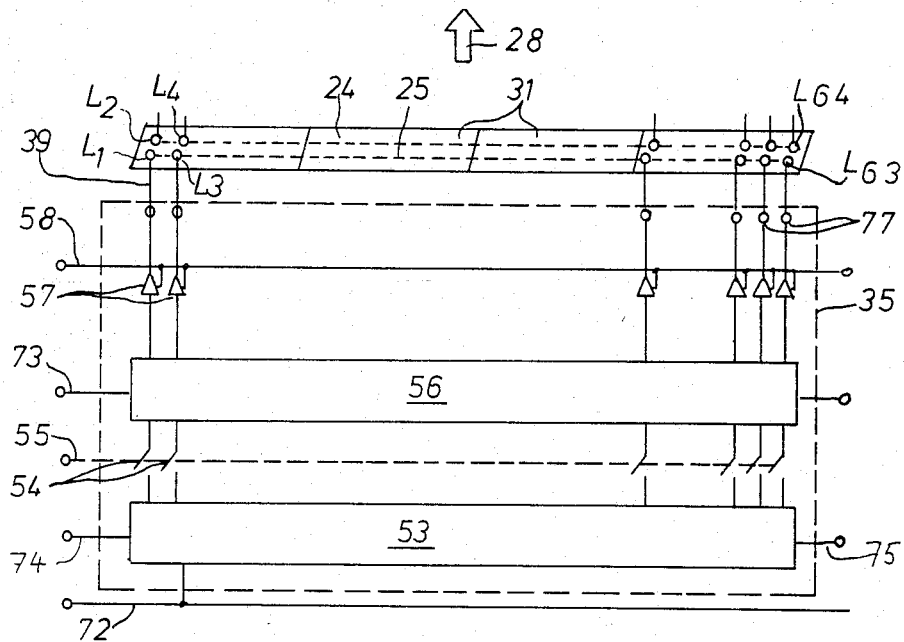
Figure 8:
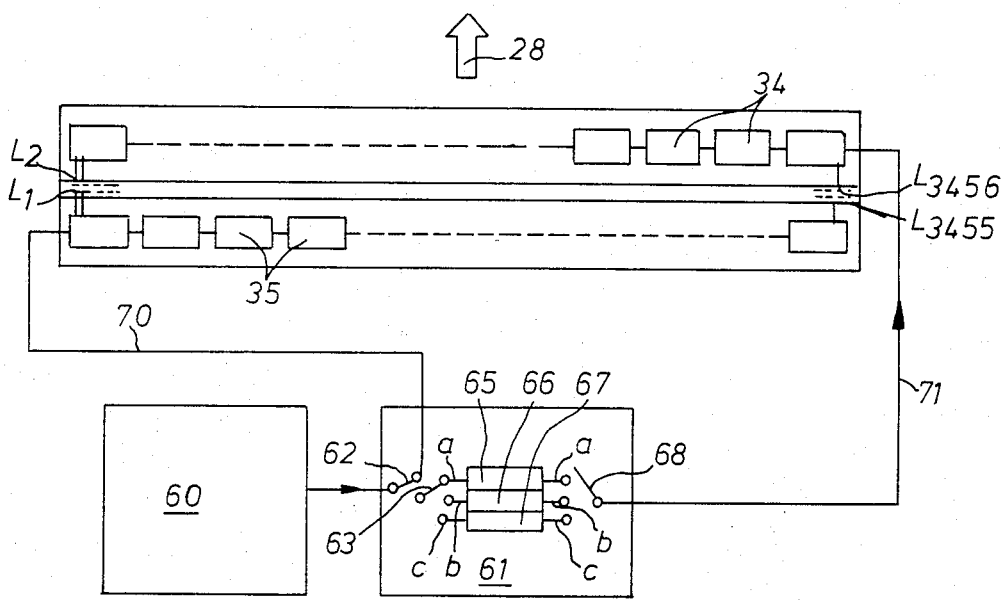
Figure 9:
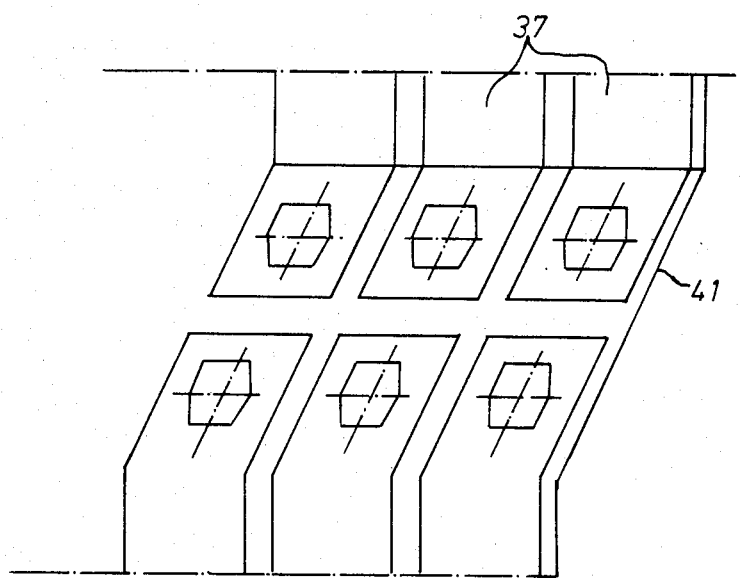

The invention will be described hereinafter by way of example with reference to the accompanying drawings, wherein:

FIG. 1 is a diagrammatic view of one embodiment of an apparatus according to the invention, FIG. 2 is a diagrammatic isometric view of the recording head and the optical transfer means of the apparatus according to FIG. 1, FIG. 3 is a diagrammatic plan view of the recording head, FIG. 4 is a diagrammatic plan view of one module of the recording head, FIG. 5 is a plan view of the configuration of the LED's of one array, and FIG. 6 is a detail view of the configuration of FIG. 5, FIG. 7 illustrates diagrammatically the electronic circuitry of one module of the recording head, FIG. 8 illustrates the electronic block circuit of the apparatus, and FIG. 9 shows another embodiment of the configuration of the LED's on a chip.

Figure 10:
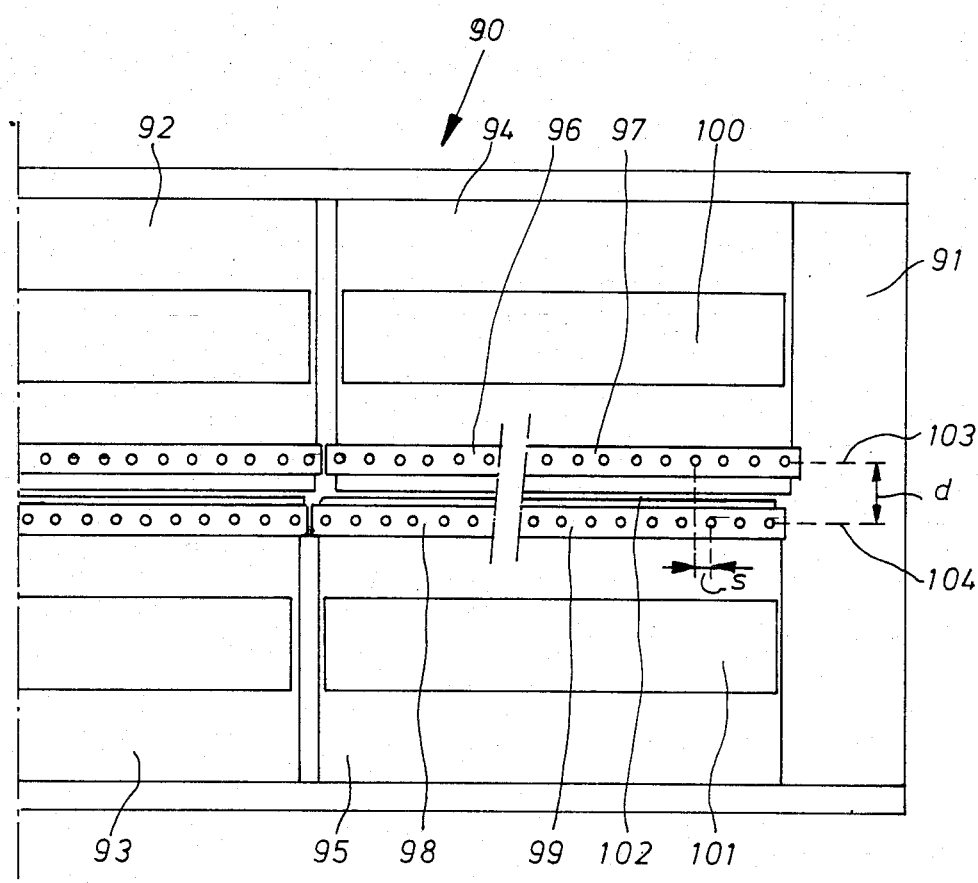

FIG. 10 is a diagrammatic plan view of a recording head wherein pairs of modules each with one row of radiation sources, are used.

Referring to FIG. 1, a recording apparatus is shown for linewise recording information upon a moving photoreceptor. The apparatus comprises basic elements known in the art such as an exposure head 10 that is provided with a great plurality of linearly arranged energizable pointlike radiation emitters 11, optical transfer means 12 for transferring the image of the emitters, and a photoreceptor in the form of a cylindrical surface of a drum 20. Known materials for the photoreceptor are doped selenium, polyvinyl carbozole, CdS, CdSe, SeTe, etc.

The operation of the apparatus may be as follows. A corona discharge station 13 electrically charges the surface of the drum 20, the sense or duration of the drum being indicated by the arrow 14. The areas of the drum surface that become exposed by the emitters become discharged whereas the other, unexposed areas maintain their charge. The electrostatic charge pattern thus produced is developed by a developing station 15 wherein a developer composition 16 is brought into contact with the charge pattern on the drum.

A corona transfer station 17 transfers the toner pattern from the drum surface onto a paper sheet 18 that is moved in contact with the drum. A corona separator station 19 is effective to separate the paper sheet from the drum. A fuser station 21 may fuse the toner pattern on the sheet so that a permanent copy is obtained. A cleaner station 9 may be operative to remove all the toner still remaining on the drum surface therefrom before a next exposure is made.

It will be understood that the present illustration of the photoreceptor in the form of a drum is merely for illustrative purposes, and it is clear that the photoreceptor may as well take other forms such as a belt for transferring the charge image to a suitable support. Further, it is clear that the final support itself may be photosensitive thereby to directly operate as a photoreceptor that is exposed. Examples of suchlike photoreceptors are supports coated with a light-sensitive layer such as ZnO, silver halide, etc.

An isometric view of part of the exposure head 10 and the optical transfer means 12 is shown in FIG. 2. The exposure head comprises an elongated channel section bar 22 wherein a plurality of exposure modules 23 are mounted next to each other. Each module comprises several arrays of emitters as will be explained further. The emitters of all the modules are arranged in two parallel rows 24 and 25, that run parallel with the axis of the drum 20.

The optical transfer means 12 is an elongated element of plastic or the like wherein a plurality of self-focussing fibers are provided, the optical axis of the transfer means, or more correctly the optical plane thereof, passing through the axis of the drum.

Due to the focussing power of the element 12, each of the rows of emitters will be imaged on a respective transverse line on the photoreceptor, namely row 24 on line 26, and row 25 on line 27, both lines being represented by a dot on the figure.

A view of the exposure head 10, from the optical transfer means towards the head, is represented in FIG. 3. A plurality of modules 23 are mounted next to each other in the bar 22 so that the total exposure length 1 corresponds with the desired width of the image on the photoreceptor. The direction of movement of the photoreceptor past the exposure head is indicated by the arrow 28. The bar 22 is made of a metal whereby three important properties are united, namely a good heat conductivity, a good dimensional stability, and a good electric conductivity. The bar may optionally be provided with fins or the like for improving the heat transfer from the bar to the air. Suitable materials for the bar are e.g. brass, aluminium and copper. The modules 23 are suitably secured in the bar by means of an electrically conductive quickly curing epoxy adhesive. The mounting of the exposure head in the apparatus may be arranged in such a way that slight adjustments of the positioning of the head are possible, thereby to ensure a true parallel alignment of the emitter rows 24 and 25 with the photoreceptor surface.

An enlarged view of one module 23 of the exposure head is illustrated in FIG. 4. The module 23 comprises a metal base plate 29 of brass, aluminium or the like, with a shape that deviates from a true rectangle by the presence of two slanting or oblique steps in its side edges at the mid-width zone of the plate. These steps have been drawn in broken lines for the base plate 29, and for the next module to the right thereof, and as a solid line 30 for the next module to the left of module 23, the latter being shown in outline only, without its corresponding LED array or chips. Four arrays 31 of emitters are mounted on the base plate in abutting relationship. Each array has two rows 24 and 25 of emitters. Since in the further description, light emitting diodes will be considered for the emitters, the term LED's will hereinafter be used for these elements. The two rows of LED's contain the same number of LED's. In the present example, each array comprises 2×16 LED's. The LED's are made on monocrystalline chips. The LED rows are staggered and the chips have been cut in the form of a parallelogram in such a way that when the four chips are mounted in mutually abutting relationship as illustrated their LED's form two uninterrupted rows. The total length n of the chip arrays 31 is slightly greater than the length o of the base plate of the module, so that first and fourth chip on each module extend beyond the slanting steps 30 the base plate 29 over a small distance in the order of magnitude of some tenths of a millimetre. Thereby it can be ensured that the end chips on the four modules are in firm contact with each other when the modules are assembled on bar 22. This is notably the case if $a_1 + a_2 = b$ seen in the detail view of FIG. 6 as will be explained hereinafter. In those cases wherein $a_1 + a_2 < b$, it will be understood that there is a spacing between the end edges of adjacent chips. The LED's of the several modules on the exposure head accordingly form two uninterrupted rows of LED's, these being uniformly spaced along the entire length of each row. For the sake of clarity, the right-hand LED array in FIG. 4 is shown spaced from the LED array on the neighbouring module. This separation will in practice be much smaller, in case $a_1 + a_2 < b$, and this spacing will even be zero for $a_1 + a_2 = b$.

The attachment of the arrays or chips 31 on the base plates 29 is preferably also effected by means of an electrically conductive quickly curing epoxy adhesive. The electrical connections to the base chip material of each LED, in the present example the cathodes of the LED's, are achieved via the bar 22.

The electric control means for the LED's are in the form of two integrated circuits 34 and 35, the circuit 34 controlling the even LED's, i.e. the LED's of row 24, and the circuit 35 controlling the odd LED's, i.e. those of row 25. The integrated circuits 34 and 35 are in the form of chips that are likewise adhered to the base plate 29. It will be understood that the mounting of the LED chips and the control chips on the base plates to form the modules, and the mounting of the modules on the bar to produce the recording head, are carried out under a microscope in view of the minute dimensions of the components. A microscope is also needed for making the electrical connections between the control circuits and the LED's as will now be described with reference to FIG. 5.

FIG. 5 is a plan view of one LED array 31. The 2×16 LED's are formed on a chip substrate 36 in the form of a parallelogram. The substrate may have a length of approximately 2 mm and a width of 1 mm. The chip has been cut from a bar that itself has been cut from a circular slice with a diameter of about 5 cm onto which a great plurality of component arrays have been formed by means of monolithic integration techniques. The chip 36 is actually a GaAs substrate that is provided at the lower side with a Au+ + Sn layer, and at the upper side with an epitaxially grown GaAsP (n-type) layer. In said upper layer there have been formed discrete Zn diffusion (p-type) areas. These are distributed in two rows 24, 25, each row comprising sixteen of such areas which are uniformly spaced and are staggered with respect to the areas of the other row. The light emission is provoked by an electric field that is produced between the lower Au+ + Sn layer and suitable electrodes that are on top of the GaAsP layer, and that surround the mentioned Zn diffusion areas. The electrodes are normally formed by aluminium strips vacuum deposited in the required pattern. As shown, the electrodes are in the form of two rows of strips 37 which at their inner ends have openings 38. These openings coincide with the sites of the mentioned Zn diffusion areas. Application of a suitable voltage to any of the electrodes causes a "LED" to be operative at the corresponding area 38. The connection between each LED and the corresponding output of the control chip is formed by fine wires of gold that are applied according to the ball-and-stitch technique known in the art. The mentioned connections have been illustrated by the wires 39 for the connection of the upper row of LED's to the corresponding output terminals 78 of control chip 34, and by the wires 79 for the connection of the lower row of LED's to the output terminals 77 of control chip 35.

The formation of rows of LED's that are uniformly spaced, by assembling component arrays, is embodied in the illustrated apparatus in the following way, described with reference to FIGS. 5 and 6.

The sections 85, 86 of the lateral ends 40, 41 of each chip which cross the rows 24, 25 of radiation sources are inclined or slanted with respect to said rows. Since in the present example the end edges of the chips are straight, it is clear that the inclination of these sections is the inclination of end edges 40 and 41. The angle of inclination is indicated by $\alpha$.

The two rows 24 and 25 of LED's are staggered over a distance s, see FIG. 6, which shows part of an array on a larger scale and shows the actual shape of the LED's. The distance between the two rows is indicated by d. In the illustrated embodiment of the apparatus according to the invention, the inclination of the chip ends 40, 41 is such that $\tan \alpha = s/d$. The electrode strips 37 run parallel with such edges 40 and 41.

A second feature is that the sum of the distances $a_1$ and $a_2$ between the ends 40 and 41, and the centers of the end LED's 42 and 43 of row 24 may not be greater than the pitch b between two successive LED's, measured on the same line 24. In the present embodiment $a_1 = a_2$ and $a_1 + a_2 = b$.

The result of the foregoing features is that uninterrupted rows of equally spaced LED's may be obtained if the LED arrays are mounted in such a way that the end edges of the successive chips abut against each other.

The mounting of the modules on the bar in such a way that the end edges of the successive chips abut against each other does not introduce any other problem since the end edges of the chips slightly project beyond the limits of the base plates of the modules, so that major alterations in the position of a module while it is embedded in the still fluid adhesive on the bar can be easily carried out under the microscope, without the necessity for the operator is to take into account the relative position of the side edges of adjacent modules.

Referring to the LED 44 (FIG. 6), it may be seen that the LED's active area actually has a skewed hexagonal form, with the upper and lower sides 45 and 46 running parallel with the direction of the rows of LED's, the sides 47 and 48 running parallel with the chip ends 40 and 41, and the sides 49 and 50 being normal to the sides 45 and 46, and hence running parallel with the direction of movement of the photoreceptor indicated by the dash and dot line 52. The described configuration of the LED's offers an adequate LED area, while yet allowing the portion of each electrode 37 that surrounds the active LED area to have a sufficient minimum width x, which minimum should in practice be not smaller than approximately 10 um to allow for manufacturing tolerances. The spacing of the LED's is such that they are not in projected image-touching relationship. Referring to FIG. 6, the projected spacing is indicated by m. It is clear that the spacing of the LED's may be such that the spacing m becomes zero, or that the projected images are even in overlapping relationship.

One of the integrated control circuits of one module, shown by the chip 35 in FIG. 4, is illustrated in detail in FIG. 7. The other control circuit 34 is the same. In chip 35, 53 is a 64-steps shift register with an input terminal 74 and an output terminal 75, whereas 54 are load switches that are simultaneously controllable by a line 55, 56 is a latch register, 57 are individual drivers for each LED, and 58 is a line via which an adjustable bias voltage can be applied to set the current produced by the drivers 57 in their operative condition. The outputs of the drivers 57 are connected by means of fine wires 39 to the corresponding LED's, $L_1$ to $L_{127}$. All described elements of the chip 35, and the chip 34 that comprises the same elements for the controlling of the LED's $L_2$ to $L_{128}$, are integrated on a monolithic silicon chip.

The output terminal 75 of the shift register 53 is connected to the input terminal 74 of the shift register of the control chip of the next module, etc., whereas the line 55 should be considered as controlling all the load switches of the control chips of all the modules.

The circuits for the control of the information flow to the recording head are illustrated diagrammatically in FIG. 8, wherein 60 is a recording signal generator, 61 is a controller with an input selector switch 62 that alternatively applies the input signal to the row of even and of odd LED's, 63 is an input memory selector with three positions a, b and c, 65, 66 and 67 are memories, 68 is an output memory selector with likewise three operative positions a, b and c. It will be understood that in practice the device will comprise many other circuits for the control of the different operations, such as a generator for a clock frequency, setting and re-setting circuits, synchronization circuits, etc. All these circuits are known in the art, and a description of them is not required for the understanding of the operation of the apparatus.

The generator 60 produces an electric recording signal for the first image line to be recorded on the photoreceptor. The switch 62 is controlled by the clock frequency, e.g. a frequency of the order of magnitude of 3 MHz, such that the signal for the first image point of the first image line is put on line 70, the signal for the second image point is put in the memory 65 through switch position 63a, the signal for the third image point on line 70, the next one in memory 65, and so on. The odd image signals that are fed to the control chips 35 via line 70 are shifted successively through the shift registers of said chips, under the control of the clock signal on line 72, until finally 1728 distinct image points have been read-in according to a serial-in mode. These are the odd image points. At the same time, 1728 even image points have been read-in in the memory 65. The total number of 3456 image points is determined by the recording head that comprises 27 modules with each four chips of 2×16 LED's.

An appropriate signal on line 55, see FIG. 7, causes the switches 54 briefly to close, so that the signals for the odd image points in the register 53 are now transferred according to a parallel-out mode to the latch register 56, and thus for each module 23. The signals are stored in the latch register 56 and the corresponding current is applied to the several LED's $L_1$ through $L_{127}$ for the first module, and to the LED's $L_1$ through $L_{3455}$ for the complete recording head.

When the photoreceptor has been advanced over a distance corresponding with the thickness of a recording line, the latch registers 56 are reset by an appropriate signal on line 73, and signals for the second image line to be recorded are produced by the generator 60.

The second line signal is now read-in, with the odd image points being again fed to the shift registers 53 of control chips 35, whereas the even image points are, however, now fed to the memory 66 through selector position 63b. The switches 54 are closed, and the odd image points of the second image line are now recorded.

The third image line recording signal is then produced by the generator 60, and the odd image points thereof are recorded as described already for the first and second lines. The even image points are stored in the memory 67 through selector position 63c. At the moment the switch 63 was put in the position 63c switch 68 was put in the position 68a, so that the even image point signals for the first image line, which were stored in memory 65 are read out into the shift registers of the control chips 34 through line 71, in synchronism with the reading-in of the odd signals of the third line into the shift registers of the chips 35. The delay of the recording the even image points over two lines with respect to the recording of the odd image points compensates for the distance d (FIG. 6) between two rows of LED's, which distance is twice the distance between successive image lines on the photoreceptor. Otherwise said, it may be considered in reference to FIG. 2 that line 26 is the first image line, whereas line 27 is already the third image line.

When the fourth image line recording signal is produced by the generator 60, the odd image point signals are directly recorded by being fed to the chips 35 via line 70, whereas the even image points are recorded through 63a in the memory 65 from which the even image point signals for the first image line have been removed in the meantime into the shift registers of the chips 34. The direct recording of the odd fourth image line signals is accompanied by a simultaneous recording of the even second line signals read from the memory 66 through switch position 68b.

The recording of the fifth and the further image lines occurs according to the same sequences just described.

The following data pertain to a particular embodiment of the invention as above described with reference to the drawings:.

Recording head:
  net recording length 1:216 mm
  number of LED's per row: 1728
  number of LED's per mm recording length: 16
  number of modules: 27
  number of LED's per chip: 2×16
  row spacing d=125μm
  LED spacing b: 125 μm
  staggering s: 62.5 μm
  angle of inclination α: 26.5650 angular degrees
  active LED area 43: 2250 μm²
  shift registers 53 and latch registers 56: 64 bits
clock frequency: 3 Mhz
optical transfer means: a Selfoc, type SLA 20, manufactured by Nippon sheet glass Co., Ltd.
recording speed: 10 cm.s¹.

The present invention is not limited to the above described embodiment.

The chips with the radiation sources may have greater lengths than the illustrated chips 31. For instance, a single chip may have a length of approximately 8 mm, thereby to completely cover the base plate of a module, and also protrude at one side edge at least of the module. It will be understood that such longer chips may reduce the yield, since the number of defect-free LED arrays that may be obtained from a wafer decreases as the number of components per chip increases.

The control chips may comprise more than one shift register, and gate means for controlling the input and outputs of said registers. In the mentioned way, a line signal may be clocked through several registers which may operate as memories for compensating the delay in the recording of two rows of image sources. This configuration would render the memory circuits 65 through 67 illustrated in FIG. 8 superfluous. Alternatively, the control chips may comprise one shift register only for the serial-in and parallel-out processing of signals, and two or more parallel registers for the successive parallel-out transfer of the signals in order to produce the desired delay over two or more line periods.

The angle $\alpha$ need not necessarily satisfy to the condition tan $\alpha = s/d$, although it appears that this condition makes possible a maximum ratio between the active LED area and the non-active LED area.

The important sections of the end edges of the LED chips insofar as their orientation is concerned are the sections which cross or intersect the rows of LED's. Another example of a suitable LED chip shape is shown in FIG. 9. In this case the end edges of the chip have oblique medial portions crossing the LED rows and the end portions of those end edges are normal to those rows and to the longer edges of the chip. As a further example, such edges can be of stepped profile, the steps at the end edge of one chip nesting into the steps of the next chip edge. Other shapings are also useful provided that the general or mean direction of the important portions of the end boundaries of the chips, that is the direction of a straight line that connects the two points of intersection of the chip end edge with the two rows of radiation sources, is oblique with respect to the rows of LED's.

As an example of a module base plate shape other than that illustrated in FIG. 4, the base plates may be in the form of a parallelogram with the parallel edges of each base plate running parallel with the rows of LED's on the chips carried by the plates. The integrated circuits for the LED's may in such a case likewise have a parallelogram space form, better suited to that shape of base plate than the rectangular space form illustrated in FIG. 4.

The apparatus may also comprise a recording head wherein pairs of modules are provided, each module comprising one row only of radiation sources. Referring to FIG. 10 which is a diagrammatic plan view of a recording head 90, an elongated bar 91 is provided with a pluarlity of pairs of modules such 92,93 and 94,95, mounted in side by side relationship to cover a recording width indicated by 1, in a way similarly as described hereinbefore with reference to FIG. 3. The modules of each pair are identical, the modules of the lower row, such as 93 and 95 being turned around 180 angular degrees in their own plane with respect to the opposed modules 92 and 94 of the upper row. The modules are formed by an electrically conductive base plate such as aluminium, brass, metal plated ceramic, or any one of the other embodiments described hereinbefore on, onto which radiation source chips such as 96,97 and 98,99, and control chips 100 and 101, are mounted. Each radiation source chip has only one row of radiation souces, LED's in the present case, and the chip ends have been cut in such a way that the chips may be lengthwise assembled to produce uninterrupted rows of equally spaced LED's. The ends of the chips extend beyond the lateral edges of the base plates of the modules so that under no circumstances do the lateral edges of the base plates of the modules touch each other on the assembled recording head. There has been left a small spacing being the chip ends of adjacent modules in the FIG. 10, but it will be understood that this spacing may be zero in case the exact distance between the two corresponding LED's requires this.

The lower modules such as 93 and 95 are slightly laterally shifted with respect to the upper modules such as 92 and 94, so that the LED's of the two rows 103 and 104 are staggered over a distance s in a way similar as described hereinbefore with reference to FIG. 6. The spacing d is preferably as small as possible and for that reason the LED chips may be mounted as close as possible near the longitudinal edge such as the edge 102 of a base plate 95. It may even be considered to make the longitudinal edge of the chip extend beyond the edge 102 of the base plate of the module so that upon assembling of the head, the longitudinal edges of opposed chips may even touch each other while yet the corresponding longitudinal edges of the base plates of the modules have no contact. In the mentioned way, the same advantages are obtained as described already for the lateral edges of the base plates.

It will be appreciated that the yield of the described arrangement may be twice the yield of the recording head illustrated in FIGS. 2 to 4. As a matter of fact, if the number of LED's per unit of length per row is equal, and the width of the modules is also equal, than it is clear that a module of the embodiment of FIG. 10 comprises only half the number of LED's of the embodiment of FIGS. 2 to 4. The number of lost LED channels in the case of one defect channel on a module is thus 64 in the embodiment of FIG. 10, and 128 in the embodiment of FIGS. 2 to 4.

The LED's may have other structures than the GaAs disclosed in the example of the invention. Other structures are well known in the art and enable the LED's to radiate in other regions of the visible spectrum than in the red region, for instance in the green, yellow or blue region.

As mentioned already in the introduction of the specification, the discrete radiation source function may also be performed by other types of active emitters, or by passive means such as light-valves that control the transmission of radiation from a suitable radiation source.

We claim:

1. In a recording apparatus for linewise recording information on a photoreceptor moving along a fixed path, said apparatus comprising a recording head carrying a multiplicity of addressable and energisable point-like radiation emitters arranged in at least one row having its length extending transversely of the path of the photoreceptor, said row being composed by the assembly in generally a line of a plurality of chip means each carrying a plurality of radiation emitters disposed in uniformly spaced apart relation in at least one row, and electrical control means for said radiation emitters, the improvement wherein said recording head comprises an elongated metal bar onto which a plurality of modules are fitted in good heat-conductive relationship, each such module comprises an electrically conductive base plate onto which a plurality of said emitter chip means is mounted generally in said line in generally abutting relation in good electrical and heat-conductive relationship, with the emitters thereof aligned in at least one extended row, the length (o) of each base plate parallel to the axis of the emitter row thereon being smaller than the aggregate length (n) of the chip means thereon so that on both ends of the base plate an end of a terminal chip means in said line extends beyond the boundary of the base plate, the spacing of the end edges of each chip means from the outermost radiation emitter thereon and the spacing of adjacent modules carrying said chip means being sufficiently close that at least one uninterrupted overall row of equally spaced radiation emitters is formed from the emitters of said modules along the length of the recording head, and said electrical control means is in the form of at least one elongated control chip mounted on each such module in common to each such extended row of emitters thereon, said control chip running parallel with its associated extended row of radiation emitters and being provided with a plurality of output terminals that are each connected by wire bonding to a corresponding radiation emitter, said control chip comprising integrated shift register means, latch register means and drivers, and also an input terminal for the serial-in loading of the shift register means and an output terminal for connection of the shift register means to the input terminal of the shift register means of the control chip of the next module.

2. A recording apparatus according to claim 1, wherein each module comprises emitter chip means with two parallel rows of emitters arranged in staggered relation, and two control chips, one at each side of the emitter chip means, each control chip being connected with the adjacent row of emitters.

3. A recording apparatus according to claim 1, wherein each module comprises emitter chip means for one row of emitters and a control chip that is connected with the respective emitters of said chip means, wherein one module forms with a second identical module that is inverted relative thereto a module pair having the relative positioning of both modules thereof such that the emitters are arranged in two parallel rows in staggered relation, and a plurality of such module pairs are lengthwise assembled to produce two uninterrupted rows of staggered radiation sources over the length of the recording head.

4. A recording apparatus according to claim 2, wherein the opposite end portions of each emitter chip which are outside the ends of the emitter rows thereon are generally inclined with respect to the length of said rows, and the sum of the distances ($a_1$, $a_2$) separating the centres of the end emitters of each row on the chip from the adjacent end edges of that chip, said distances being measured along the lengthwise axis of the respective row, is not greater than the spacing (b) between the centres of adjacent pairs of emitters in such row.

5. A recording apparatus according to claim 4, wherein the angle between said general direction of said end portions and the direction of the path of said photoreceptor is such that $\alpha = s/d$, wherein s is the distace of pitch between corresponding emitters of two rows of emitters, and d is the distance between said two rows.

6. A recording apparatus according to claim 5, wherein $\alpha = 26.5650$ degrees.

7. A recording apparatus according to claim 4, wherein the base plates of the modules have straight side edges parallel to the path of the moving photoreceptor that, at each location where the emitter chip means extends beyond the base plate boundary, are interrupted by a side edge section that is inclined from said path and parallel with the inclination of the outside end portion of the emitter chip means.

8. A recording apparatus according to claim 1, wherein said emitters are light-emitting diodes.

* * * * *